(12) United States Patent
Isono et al.

(10) Patent No.: US 12,421,625 B2
(45) Date of Patent: Sep. 23, 2025

(54) GROUP III NITRIDE STACK

(71) Applicant: SUMITOMO CHEMICAL COMPANY, LIMITED, Tokyo (JP)

(72) Inventors: Ryota Isono, Hitachi (JP); Takeshi Tanaka, Hitachi (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 499 days.

(21) Appl. No.: 17/992,880

(22) Filed: Nov. 22, 2022

(65) Prior Publication Data

US 2023/0167585 A1 Jun. 1, 2023

(30) Foreign Application Priority Data

Dec. 1, 2021 (JP) .................. 2021-195190

(51) Int. Cl.
*C30B 29/40* (2006.01)
(52) U.S. Cl.
CPC .................. *C30B 29/406* (2013.01)
(58) Field of Classification Search
CPC .................................. C30B 29/406
USPC ....................................... 423/409
See application file for complete search history.

(56) References Cited

U.S. PATENT DOCUMENTS

| 2018/0366572 A1* | 12/2018 | Tanaka ................. H10D 30/475 |
| 2020/0328279 A1 | 10/2020 | Hikosaka et al. |
| 2020/0399184 A1* | 12/2020 | Tanaka ................... B32B 18/00 |

FOREIGN PATENT DOCUMENTS

| JP | 2015-070085 A | 4/2015 |
| JP | 2016-048790 A | 4/2016 |
| JP | 2020-177940 A | 10/2020 |

\* cited by examiner

*Primary Examiner* — In Suk C Bullock
(74) *Attorney, Agent, or Firm* — Foley & Lardner LLP

(57) ABSTRACT

There is provided a Group III nitride stack in which the concentration of an impurity in the buffer/channel layer of an HEMT is suppressed to a predetermined range. The Group III nitride stack includes a first layer comprising gallium nitride, and a second layer on the first layer, the second layer comprising a Group III nitride having a lower electron affinity than gallium nitride. The first layer includes a lower layer and an upper layer on the lower layer. The carbon concentration in the upper layer is lower than a carbon concentration in the lower layer, the hydrogen concentration in the upper layer is lower than a hydrogen concentration in the lower layer, the carbon concentration in the upper layer is $5 \times 10^{16}$ cm$^{-3}$ or less, and the hydrogen concentration in the upper layer is $1 \times 10^{17}$ cm$^{-3}$ or less.

10 Claims, 2 Drawing Sheets

GROUP III NITRIDE STACK

TECHNICAL FIELD

The present disclosure relates to a Group III nitride stack.

DESCRIPTION OF RELATED ART

Development is progressing on an epitaxial substrate obtained by growing a Group III nitride layer on a silicon carbide substrate. Such an epitaxial substrate is used as a material for producing a semiconductor device such as a high electron mobility transistor (HEMT) (e.g., see Patent Document 1).

The buffer/channel layer in a HEMT is composed of GaN, for example. The concentrations of impurities such as carbon in the buffer/channel layer affect the performance of the HEMT.

PRIOR ART DOCUMENT

Patent Document

Patent Document 1: Japanese Patent Laid Open Publication No. 2016-48790

SUMMARY

Problem to be Solved by Disclosure

An object of the present disclosure is to provide a Group III nitride stack in which the concentration of an impurity in the buffer/channel layer of an HEMT is suppressed to a predetermined range.

Means for Solving Problem

According to an aspect of the present disclosure, there is provided a Group III nitride stack including:
a first layer comprising gallium nitride; and
a second layer on the first layer, the second layer comprising a Group III nitride having a lower electron affinity than gallium nitride,
wherein the first layer includes a lower layer and an upper layer on the lower layer,
a carbon concentration in the upper layer is lower than a carbon concentration in the lower layer,
a hydrogen concentration in the upper layer is lower than a hydrogen concentration in the lower layer,
the carbon concentration in the upper layer is $5 \times 10^{16}$ cm$^{-3}$ or less, and
the hydrogen concentration in the upper layer is $1 \times 10^{17}$ cm$^{-3}$ or less.

Advantage of Disclosure

Accordingly, it is possible to provide a Group III nitride stack in which the concentration of an impurity in a buffer/channel layer (first layer) of an HEMT is suppressed to a predetermined range.

DETAILED DESCRIPTION OF THE DISCLOSURE

Embodiment

Figure 1:
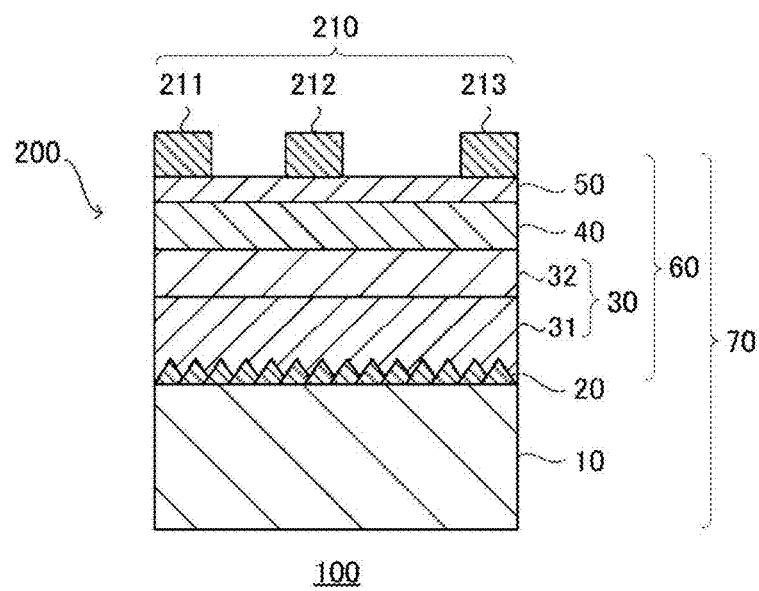
FIG. 1 is a schematic cross-sectional view of a Group III nitride stack according to an embodiment of the present disclosure.

The following describes a Group III nitride stack 100 (hereinafter also referred to as the stack 100) according to an embodiment of the present disclosure. FIG. 1 is a schematic cross-sectional view illustrating the stack 100. The stack 100 includes a substrate 10 and a Group III nitride layer 60 (hereinafter also referred to as an epi-layer 60) composed of a Group III nitride and formed on the substrate 10. The epi-layer 60 illustrated in FIG. 1 includes a nucleation layer 20, a buffer/channel layer 30, a barrier layer 40, and a cap layer 50. As will be described below, one feature of the stack 100 according to the present embodiment is that the concentration of an impurity such as carbon in the buffer/channel layer 30 is suppressed to a predetermined range.

The stack 100 may be in the form of an epitaxial substrate 70 (hereinafter also referred to as the epi-substrate 70) that includes the substrate 10 and the epi-layer 60, for example. As another example, the stack 100 may be in the form of a semiconductor device formed with use of the epi-substrate 70, or more specifically may be in the form of a high electron mobility transistor (HEMT) 200 formed by providing electrodes 210 (a source electrode 211, a gate electrode 212, and a drain electrode 213) on the epi-layer 60. FIG. 1 illustrates the stack 100 in the form of the HEMT 200. The stack 100 in the form of the HEMT 200 may be in the form of a wafer, or may be in the form of a chip obtained by cutting such a wafer.

The substrate 10 is composed of silicon carbide (SiC) and is a ground substrate for the heteroepitaxial growth of the epi-layer 60. As one example, polytype 4H or polytype 6H semi-insulating SiC is used as the SiC composing the substrate 10. Here, "semi-insulating" means that the specific resistance is $10^5$ Ω cm or more, for example. The surface of the substrate 10 on which the epi-layer 60 is grown is a (0001) plane (c-plane silicon plane), for example.

The nucleation layer 20 is formed on the substrate 10. The nucleation layer 20 is composed of aluminum nitride (AlN) and functions as a nucleation layer that generates nuclei for crystal growth of the buffer/channel layer 30. The thickness of the nucleation layer 20 is preferably 1 nm or more and 200 nm or less, for example.

The buffer/channel layer 30 is formed on the nucleation layer 20. The buffer/channel layer 30 is composed of gallium nitride (GaN). The lower layer 31, which is the lower portion of the buffer/channel layer 30, is a base for growing the upper layer 32, which is the upper portion of the buffer/channel layer 30, and functions as a buffer layer that improves the crystallinity of the upper layer 32. Also, the upper layer 32 functions as a channel layer through which electrons travel when the HEMT 200 is in operation. In order for the lower layer 31 to have suitable crystallinity as a base for growing the upper layer 32, the thickness of the lower layer 31 is preferably 100 nm or more, for example. Also, in order for the upper layer 32 to suitably function as a channel layer, the thickness of the upper layer 32 is preferably 50 nm or more, for example. Since excessive thickness of the lower layer 31 and the upper layer 32 invites an unnecessary increase in cost, the thickness of the lower layer 31 is preferably 800 nm or less, for example, and the thickness of the upper layer 32 is preferably 300 nm or less, for example.

The barrier layer 40 is formed on the buffer/channel layer 30. The barrier layer 40 is composed of a Group III nitride having a lower electron affinity than the GaN forming the buffer/channel layer 30, and one example is aluminum gallium nitride (AlGaN) containing aluminum (Al) and gallium (Ga) as Group III elements. The barrier layer 40 functions as a barrier layer that allows two-dimensional electron gas (2 DEG) to be generated in the upper layer 32 of the buffer/channel layer 30 and spatially confines the 2 DEG within the upper layer 32. The thickness of the barrier layer 40 is preferably 1 nm or more and 50 nm or less, for example.

The cap layer 50 is formed on the barrier layer 40. The cap layer 50 is composed of GaN, for example, and is interposed between the barrier layer 40 and the electrode 210 in order to improve a device characteristic (e.g., threshold voltage controllability) of the HEMT 200. The cap layer 50 may be formed or omitted as necessary.

A source electrode 211, a gate electrode 212, and a drain electrode 213 are formed on the epi-layer 60, as the electrodes 210 of the HEMT 200. The gate electrode 212 is composed of a Ni/Au layer including a stack of a nickel (Ni) layer and a gold (Au) layer, for example. Note that in this specification, when a stack is denoted as an "X/Y layer", this means that X and Y are formed on the cap layer 50 (or on the barrier layer 40 in the case where the cap layer 50 is omitted) in the order of X and then Y. The source electrode 211 and the drain electrode 213 are each composed of a Ti/Al layer obtained by stacking a titanium (Ti) layer and an Al layer, for example. As another example, the source electrode 211 and the drain electrode 213 may each be obtained by stacking a Ni/Au layer on a Ti/Al layer.

Figure 2:
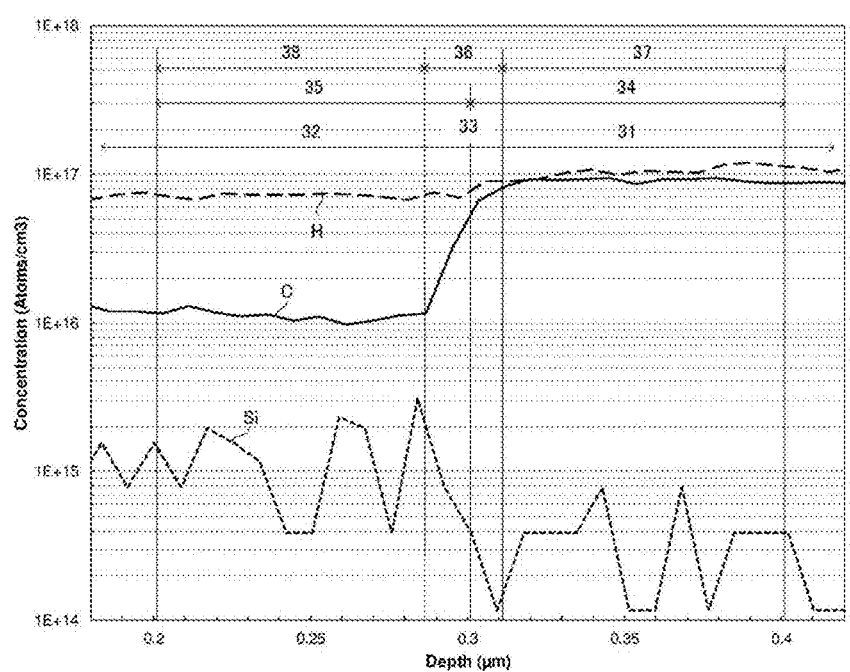
FIG. 2 shows a first example of a SIMS profile showing the C concentration, the H concentration, and the Si concentration in an upper layer and a lower layer of a buffer/channel layer according to the embodiment.
Figure 3:
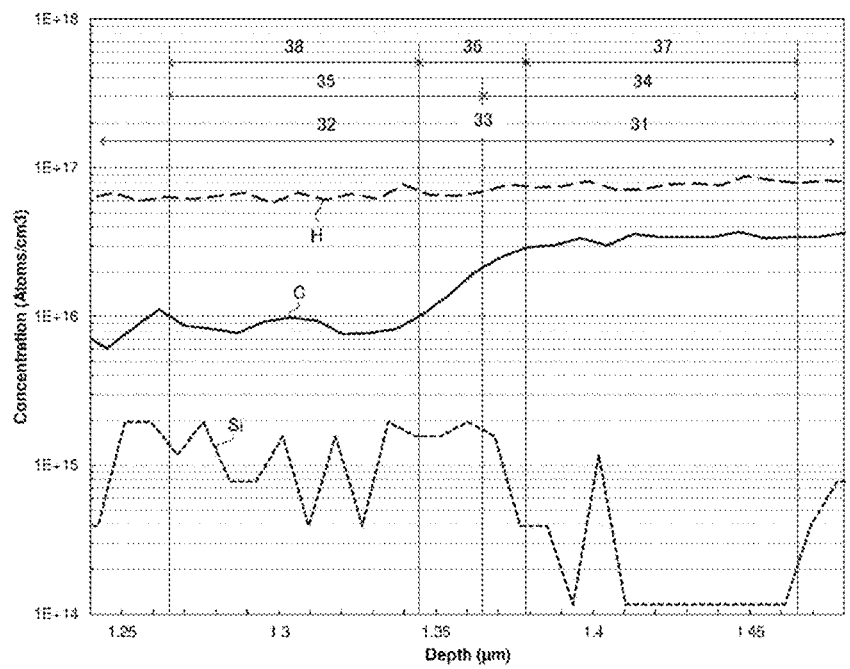
FIG. 3 shows a second example of a SIMS profile showing the C concentration, the H concentration, and the Si concentration in the upper layer and the lower layer of the buffer/channel layer according to the embodiment.

The following further describes impurity concentrations in the lower layer 31 and the upper layer 32 of the buffer/channel layer 30. FIGS. 2 and 3 each show a secondary ion mass spectrometry (SIMS) profile showing the carbon (C) concentration, the hydrogen (H) concentration, and the silicon (Si) concentration as impurity concentrations in the lower layer 31 and the upper layer 32. FIGS. 2 and 3 respectively show a first example and a second example of SIMS profiles of the lower layer 31 and the upper layer 32. Note that FIGS. 2 and 3 show SIMS profiles measured for samples produced in a test for suppressing the C concentration, the H concentration, and the Si concentration to predetermined concentrations in the lower layer 31 and the upper layer 32, and the values of depth in these SIMS profiles do not directly indicate values of depth in the stack 100.

These figures show SIMS profiles for a region near the interface between the lower layer 31 and the upper layer 32 (formed directly on the lower layer 31), in order to illustrate differences in the C, H, and Si concentration between the lower layer 31 and the upper layer 32. Portions 34 and 35 having a predetermined thickness (100 nm in this example) are set respectively below and above a boundary 33 between the lower layer 31 and the upper layer 32. The lower predetermined thickness portion 34 includes a constant region 37 that has a small amount of change in the C concentration and is located outside (below) a slope region 36 having a high amount of change in the C concentration, and the average values of the C concentration, the H concentration, and the Si concentration in the constant region 37 are assumed to be the C concentration, the H concentration, and the Si concentration in the lower layer 31. Similarly, the upper predetermined thickness portion 35 includes a constant region 38 that has a small amount of change in the C concentration and is located outside (above) the slope region 36 having a high amount of change in the C concentration, and the average values of the C concentration, the H concentration, and the Si concentration in the constant region 38 are assumed to be the C concentration, the H concentration, and the Si concentration in the upper layer 32. The boundary 33 is set at a position where the C concentration is substantially between (the average of) the C concentration of the lower layer 31 and the C concentration of the upper layer 32, for example.

In both the lower constant region 37 and the upper constant region 38, the standard of variation of the C concentration from the average value of the C concentration is ±25% or less, for example, or ±20% or less, for example. In the first example and the second example, both the lower constant region 37 and the upper constant region 38 are regions in which the variation is ±20% or less over a thickness of 50 nm or more.

In the first example (FIG. 2), the concentrations of the impurities are as follows. The C concentration in the lower layer 31 is $9.1 \times 10^{16}$ cm$^{-3}$ and the C concentration in the upper layer 32 is $1.1 \times 10^{16}$ cm$^{-3}$. The H concentration in the lower layer 31 is $1.1 \times 10^{17}$ cm$^{-3}$ and the H concentration in the upper layer 32 is $7.2 \times 10^{16}$ cm$^{-3}$. The Si concentration in the lower layer 31 is $3.6 \times 10^{14}$ cm$^{-3}$ and the Si concentration in the upper layer 32 is $1.4 \times 10^{15}$ cm$^{-3}$.

In the second example (FIG. 3), the concentrations of the impurities are as follows. The C concentration in the lower layer 31 is $3.3 \times 10^{16}$ cm$^{-3}$ and the C concentration in the upper layer 32 is $8.9 \times 10^{15}$ cm$^{-3}$. The H concentration in the lower layer 31 is $7.7 \times 10^{16}$ cm$^{-3}$ and the H concentration in the upper layer 32 is $6.5 \times 10^{16}$ cm$^{-3}$. The Si concentration in the lower layer 31 is $2.7 \times 10^{14}$ cm$^{-3}$ and the Si concentration in the upper layer 32 is $1.2 \times 10^{15}$ cm$^{-3}$.

As can be understood from the SIMS profiles of the first example and the second example, the concentrations of impurities in the lower layer 31 and the upper layer 32 have characteristics such as those described below. Examples of effects that can thus be obtained are also described below.

The C concentration in the upper layer 32 is lower than the C concentration in the lower layer 31. Due to the C concentration in the upper layer 32 being lower, the crystallinity of the upper layer 32 can be made higher than the crystallinity of the lower layer 31. The upper layer 32 is the portion where 2 DEG is formed, and becomes the channel of the HEMT 200, and therefore the high crystallinity of the upper layer 32 makes it possible to improve the performance of the HEMT 200. Specifically, the C concentration in the upper layer 32 is preferably $5 \times 10^{16}$ cm$^{-3}$ or less.

The H concentration in the upper layer 32 is lower than the H concentration in the lower layer 31. Due to the H concentration in the upper layer 32 being lower, the diffusion of H contained in the upper layer 32 into the barrier layer 40 can be suppressed, and variation in the H concentration in the upper layer 32 over time can be suppressed. Since electrons in 2 DEG formed in the upper layer 32 are likely to be attracted to hydrogen ions (H$^+$ ions), in the case where the H concentration in the upper layer 32 changes significantly over time, the 2 DEG concentration changes over time. Suppressing variation in the H concentration in the upper layer 32 over time makes it possible to suppress variation in the 2 DEG concentration over time, thereby making it possible to suppress variation in the performance of the HEMT 200 over time. Specifically, the H concentration in the upper layer 32 is preferably $1 \times 10^{17}$ cm$^{-3}$ or less.

The C concentration in the upper layer 32 is lower than the C concentration in the lower layer 31, or in other words, the C concentration in the lower layer 31 is higher than the C concentration in the upper layer 32. Due to the C concentration in the lower layer 31 being higher, the electrical conductivity of the lower layer 31 can be made lower than the electrical conductivity of the upper layer 32. The leakage current of the HEMT 200 can thus be suppressed. Specifically, the C concentration in the lower layer 31 is preferably higher than the C concentration in the upper layer 32 by $2 \times 10^{16}$ cm$^{-3}$ or more.

Note that, in the present embodiment, the C concentration in the lower layer 31 is suppressed. Specifically, the C concentration in the lower layer 31 is preferably $5 \times 10^{17}$ cm$^{-3}$ or less, and more preferably $1 \times 10^{17}$ cm$^{-3}$ or less. By suppressing the C concentration in the lower layer 31, it is possible to add C to the lower layer 31 while also suppressing deterioration of the crystallinity of the lower layer 31 due to the addition of C. Accordingly, the lower layer 31 formed as a buffer layer can have high crystallinity even in the case of being thin.

The H concentration in the upper layer 32 is lower than the H concentration in the lower layer 31, or in other words, the H concentration in the lower layer 31 is higher than the H concentration in the upper layer 32. As will be described later, by increasing the proportion of hydrogen gas in the carrier gas used in the growth period of the lower layer 31 (compared with the proportion of hydrogen gas in the carrier gas used in the growth period of the upper layer 32), it is possible to suppress deterioration of the crystallinity of the lower layer 31 in the case where C is added to the lower layer 31. Accordingly, the H concentration in the lower layer 31 is higher than the H concentration in the upper layer 32.

However, in the case where the H concentration in the lower layer 31 is excessively higher than the H concentration in the upper layer 32, there is concern of the H concentration in the upper layer 32 rising due the diffusion of H contained in the lower layer 31. For this reason, the ratio of the H concentration in the lower layer 31 to the H concentration in the upper layer 32 is preferably small. The ratio of the H concentration in the lower layer 31 to the H concentration in the upper layer 32 is 1.5:1 in the first example and 1.2:1 in the second example. The ratio of the H concentration in the lower layer 31 to the H concentration in the upper layer 32 is preferably 5:1 or less, more preferably 3:1 or less, and even more preferably 2:1 or less, for example. Specifically, the H concentration in the lower layer 31 is preferably $1 \times 10^{18}$ cm$^{-3}$ or less, and more preferably $5 \times 10^{17}$ cm$^{-3}$ or less.

Another characteristic of the C concentration and the H concentration observed from the SIMS profiles of the first example and the second example is that the C concentration in the upper layer 32 is lower than the H concentration in the upper layer 32, for example. Also, the C concentration in the lower layer 31 is lower than the H concentration in the lower layer 31, for example.

The Si concentration in the upper layer 32 is higher than the Si concentration in the lower layer 31. A higher Si concentration in the upper layer 32 compensates for electron trapping in the channel, thereby suppressing current collapse. Also, due to the Si concentration in the upper layer 32 being higher, the distribution of electrons in the vertical direction (thickness direction) is controlled such that electrons are concentrated on the upper layer 32 side, thus making it possible to improve the cut-off characteristics. Specifically, the Si concentration in the upper layer 32 is preferably $5 \times 10^{14}$ cm$^{-3}$ or more, and more preferably $1 \times 10^{15}$ cm$^{-3}$ or more. Note that an excessively high Si concentration in the upper layer 32 causes an increase in leakage current. For this reason, the Si concentration in the upper layer 32 is preferably $1 \times 10^{16}$ cm$^{-3}$ or less.

The Si concentration in the upper layer 32 is higher than the Si concentration in the lower layer 31, or in other words, the Si concentration in the lower layer 31 is lower than the Si concentration in the upper layer 32. Due to the Si concentration in the lower layer 31 being lower, the electrical conductivity of the lower layer 31 can be made lower than the electrical conductivity of the upper layer 32. The leakage current of the HEMT 200 can thus be suppressed. Specifically, the Si concentration in the lower layer 31 is preferably less than $5 \times 10^{14}$ cm$^{-3}$.

In the first example and the second example, the following impurity concentrations were obtained. The C concentration in the upper layer 32 is $5 \times 10^{16}$ cm$^{-3}$ or less, and more specifically $2 \times 10^{16}$ cm$^{-3}$ or less. The H concentration in the upper layer 32 is $1 \times 10^{17}$ cm$^{-3}$ or less, and more specifically $8 \times 10^{16}$ cm$^{-3}$ or less. The C concentration in the lower layer 31 is $5 \times 10^{17}$ cm$^{-3}$ or less, and more specifically $1 \times 10^{17}$ cm$^{-3}$ or less. The H concentration in the lower layer 31 is $5 \times 10^{17}$ cm$^{-3}$ or less, and more specifically $2 \times 10^{17}$ cm$^{-3}$ or less. The Si concentration in the upper layer 32 is ($1 \times 10^{16}$ cm$^{-3}$ or less, and more specifically $5 \times 10^{15}$ cm$^{-3}$ or less, and) $5 \times 10^{14}$ cm$^{-3}$ or more, and more specifically $1 \times 10^{15}$ cm$^{-3}$ or more. The Si concentration in the lower layer 31 is less than $5 \times 10^{14}$ cm$^{-3}$, and more specifically $4 \times 10^{14}$ cm$^{-3}$ or less.

Next, a method for producing the stack 100 according to the embodiment will be described. The following illustrates a method for producing the stack 100 that is in the form of the HEMT 200. First, a method for producing the epi-substrate 70 will be described. A SiC substrate is prepared as the substrate 10. The epi-substrate 70 is formed by using metalorganic vapor phase epitaxy (MOVPE) to grow the nucleation layer 20, the buffer/channel layer 30, the barrier layer 40, and (optionally) the cap layer 50, which are the layers that constitute the epi-layer 60, on the substrate 10.

Among Group III source gases, trimethylaluminum (Al(CH$_3$)$_3$, TMA) gas is used as the Al source gas, for example. Among Group III source gases, trimethylgallium (Ga(CH$_3$)$_3$, TMG) gas is used as the Ga source gas, for example. Ammonia (NH$_3$) gas, for example, is used as the nitrogen (N) source gas, which is a Group V source gas. At least either nitrogen gas (N$_2$ gas) or hydrogen gas (H$_2$ gas) is used as the carrier gas, for example. The growth temperature can be selected from the range of 900° C. to 1400° C., for example, and the V/III ratio, which is the flow rate ratio of the Group V source gas to the Group III source gas, can be selected from the range of 10 to 5000, for example. The ratio of the supply amounts of the source gases is adjusted according to the compositions of the layers that are to be formed. The thicknesses of the formed layers can be controlled using the growth time, which is calculated according to the design thickness from a growth rate obtained in a preliminary experiment, for example.

Figure 4:
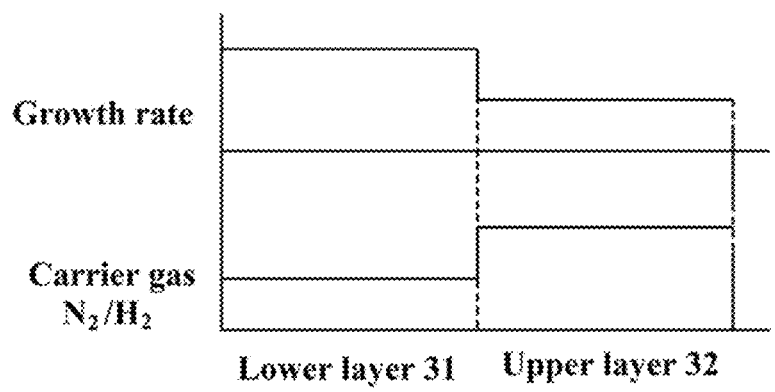
FIG. 4 is a timing chart schematically illustrating differences in growth conditions between the lower layer and the upper layer of the buffer/channel layer according to the embodiment.

The following particularly describes the process of forming the buffer/channel layer 30. FIG. 4 is a timing chart schematically illustrating differences in growth conditions between the lower layer 31 and the upper layer 32 of the buffer/channel layer 30. The lower layer 31 and the upper layer 32 are composed of GaN and grown by supplying a Ga source gas and a N source gas together with a carrier gas. The growth conditions are changed between the lower layer 31 and the upper layer 32 in order to control the concentrations of impurities in the lower layer 31 and the upper layer 32 as described above.

In the present embodiment, as shown in FIG. 4, the growth rate of the upper layer 32 in the growth period of the upper layer 32 is set lower (slower) than the growth rate of the lower layer 31 in the growth period of the lower layer 31. Specifically, for example, the growth rate of the upper layer 32 is set lower than the growth rate of the lower layer 31 by setting the growth temperature and the growth pressure higher in the growth period of the upper layer 32 than in the growth period of the lower layer 31. Also, the proportion of $H_2$ gas in the carrier gas used in the growth period of the upper layer 32 is set lower (smaller) than the proportion of $H_2$ gas in the carrier gas used in the growth period of the lower layer 31.

For example, in the growth period of the lower layer 31, the growth temperature is set to a lower temperature within a predetermined temperature range (e.g., 900° C. or more to less than 1040° C.), and the growth pressure is set to a lower pressure within a predetermined pressure range (e.g., 6.7 kPa or more to less than 13.3 kPa). Furthermore, in the growth period of the lower layer 31, a gas mixture including $H_2$ gas and $N_2$ gas is used as the carrier gas, and the proportion of $H_2$ gas in the gas mixture is set to a higher value (e.g., ($N_2$ gas partial pressure)/($H_2$ gas partial pressure) is 0.5 or more and less than 1.0).

For example, in the growth period of the upper layer 32, the growth temperature is set to a higher temperature within a predetermined temperature range (e.g., 1040° C. or more to 1200° C. or less), and the growth pressure is set to a higher pressure within a predetermined pressure range (e.g., 13.3 kPa or more to 66.7 kPa or less). Furthermore, in the growth period of the upper layer 32, only $N_2$ gas is used as the carrier gas, or a gas mixture including $H_2$ gas and $N_2$ gas is used as the carrier gas, and the proportion of $H_2$ gas in the gas mixture is set to a lower value (e.g., ($N_2$ gas partial pressure)/($H_2$ gas partial pressure) is 1.0 or more and 3.0 or less).

In the growth period of the upper layer 32, by raising the growth temperature and the growth pressure, the growth rate of the upper layer 32 is lower than the growth rate of the lower layer 31, and therefore the decomposition of the Ga source is relatively promoted in the growth period of the upper layer 32 and relatively suppressed in the growth period of the lower layer 31. Accordingly, the C concentration is relatively lower in the upper layer 32 and relatively higher in the lower layer 31.

In the growth period of the lower layer 31, the crystallinity of the GaN forming the lower layer 31 can be improved by increasing the proportion of $H_2$ gas in the carrier gas. Accordingly, it is possible to add C to the lower layer 31 while also suppressing deterioration of the crystallinity of the lower layer 31 due to the addition of C. On the other hand, in the growth period of the upper layer 32, the introduction of H into the upper layer 32 can be suppressed by lowering the proportion of $H_2$ gas in the carrier gas. In this way, the H concentration is relatively lower in the upper layer 32 and relatively higher in the lower layer 31. Also, the H concentration in the upper layer 32 can be $1\times10^{17}$ cm$^{-3}$ or less.

Si is supplied to (mixed into) the growth layer at a constant rate from the furnace wall of the MOVPE apparatus, for example. For this reason, the lower the growth rate is, the higher the Si concentration is in the growth layer. For this reason, by setting the growth rate of the upper layer 32 lower than the growth rate of the lower layer 31, the Si concentration in the upper layer 32 becomes relatively higher and the Si concentration in the lower layer 31 becomes relatively lower.

Note that growth conditions (e.g., the growth temperature, the growth pressure, the V/III ratio, and the composition of the carrier gas) for obtaining predetermined impurity concentrations in the growth period of the lower layer 31 and the growth period of the upper layer 32 may be appropriately adjusted in accordance with the MOVPE apparatus that is used, for example.

After the epi-substrate 70 is produced, the HEMT 200 is produced by forming the electrodes 210 (the source electrode 211, the gate electrode 212, and the drain electrode 213) on the epi-layer 60. Note that other members such as a protective film may be formed as necessary when producing the HEMT 200. The electrodes 210, the protective film, and the like may be formed using known techniques. The stack 100 according to the present embodiment is manufactured as described above.

As described above, according to the present embodiment, it is possible to obtain the stack 100 in which the concentration of an impurity in the buffer/channel layer 30 (in the lower layer 31 and the upper layer 32) of the HEMT 200 is suppressed to a predetermined range. For example, by setting the C concentration in the upper layer 32 lower than the C concentration in the lower layer 31 (buffer layer), that is to say to $5\times10^{16}$ cm$^{-3}$ or less, it is possible to set the electrical conductivity of the lower layer 31 lower than that of the upper layer 32 and suppress leakage current, while also improving the crystallinity of the upper layer 32. Also, for example, by setting the H concentration in the upper layer 32 lower than the H concentration in the lower layer 31 to $1\times10^{17}$ cm$^{-3}$ or less, it is possible to suppress variation in the performance of the HEMT 200 over time.

Preferable Aspects of Present Disclosure

Preferable aspects of the present disclosure will be supplementarily described hereinafter.

Supplementary Description 1

According to an aspect of the present disclosure, there is provided a Group III nitride stack including:
a first layer comprising gallium nitride; and
a second layer on the first layer, the second layer comprising a Group III nitride having a lower electron affinity than gallium nitride,
wherein the first layer includes a lower layer and an upper layer on the lower layer,
a carbon concentration in the upper layer is lower than a carbon concentration in the lower layer,
a hydrogen concentration in the upper layer is lower than a hydrogen concentration in the lower layer,
the carbon concentration in the upper layer is $5\times10^{16}$ cm$^{-3}$ or less, and
the hydrogen concentration in the upper layer is $1\times10^{17}$ cm$^{-3}$ or less.

Supplementary Description 2

Preferably, there is provided the Group III nitride stack according to the supplementary description 1, wherein the carbon concentration in the lower layer is higher than the carbon concentration in the upper layer by $2\times10^{16}$ cm$^{-3}$ or more.

Supplementary Description 3

Preferably, there is provided the Group III nitride stack according to the supplementary description 1 or 2, wherein the carbon concentration in the lower layer is $5\times10^{17}$ cm$^{-3}$ or less (more preferably $1\times10^{17}$ cm$^{-3}$ or less).

Supplementary Description 4

Preferably, there is provided the Group III nitride stack according to any one of the supplementary descriptions 1 to 3, wherein a ratio of the hydrogen concentration in the lower layer to the hydrogen concentration in the upper layer is 5:1 or less (more preferably 3:1 or less, and even more preferably 2:1 or less).

Supplementary Description 5

Preferably, there is provided the Group III nitride stack according to any one of the supplementary descriptions 1 to 4, wherein the hydrogen concentration in the lower layer is $1\times10^{18}$ cm$^{-3}$ or less (more preferably $5\times10^{17}$ cm$^{-3}$ or less).

Supplementary Description 6

Preferably, there is provided the Group III nitride stack according to any one of the supplementary descriptions 1 to 5, wherein the carbon concentration in the upper layer is lower than the hydrogen concentration in the upper layer.

Supplementary Description 7

Preferably, there is provided the Group III nitride stack according to any one of the supplementary descriptions 1 to 6, wherein the carbon concentration in the lower layer is lower than the hydrogen concentration in the lower layer.

Supplementary Description 8

Preferably, there is provided the Group III nitride stack according to any one of the supplementary descriptions 1 to 7, wherein a silicon concentration in the upper layer is higher than a silicon concentration in the lower layer.

Supplementary Description 9

Preferably, there is provided the Group III nitride stack according to any one of the supplementary descriptions 1 to 8, wherein a silicon concentration in the upper layer is ($1\times10^{16}$ cm$^{-3}$ or less and) $5\times10^{14}$ cm$^{-3}$ or more (more preferably $1\times10^{15}$ cm$^{-3}$ or more).

Supplementary Description 10

Preferably, there is provided the Group III nitride stack according to any one of the supplementary descriptions 1 to 9, wherein a silicon concentration in the lower layer is less than $5\times10^{14}$ cm$^{-3}$.

DESCRIPTION OF SIGNS AND NUMERALS

10 Substrate
20 Nucleation layer
30 Buffer/channel layer
31 Lower layer (of buffer/channel layer)
32 Upper layer (of buffer/channel layer)
40 Barrier layer
50 Cap layer
60 Group III nitride layer
70 Epitaxial substrate
100 Group III nitride stack
200 HEMT
210 Electrode
211 Source electrode
212 Gate electrode
213 Drain electrode

The invention claimed is:

1. A Group III nitride stack comprising:
a first layer comprising gallium nitride; and
a second layer on the first layer, the second layer comprising a Group III nitride having a lower electron affinity than gallium nitride,
wherein the first layer includes a lower layer and an upper layer on the lower layer,
a carbon concentration in the upper layer is lower than a carbon concentration in the lower layer,
a hydrogen concentration in the upper layer is lower than a hydrogen concentration in the lower layer,
the carbon concentration in the upper layer is $5\times10^{16}$ cm$^{-3}$ or less, and
the hydrogen concentration in the upper layer is $1\times10^{17}$ cm$^{-3}$ or less.

2. The Group III nitride stack according to claim 1, wherein the carbon concentration in the lower layer is higher than the carbon concentration in the upper layer by $2\times10^{16}$ cm$^{-3}$ or more.

3. The Group III nitride stack according to claim 1, wherein the carbon concentration in the lower layer is $5\times10^{17}$ cm$^{-3}$ or less.

4. The Group III nitride stack according to claim 1, wherein a ratio of the hydrogen concentration in the lower layer to the hydrogen concentration in the upper layer is 5:1 or less.

5. The Group III nitride stack according to claim 1, wherein the hydrogen concentration in the lower layer is $1\times10^{18}$ cm$^{-3}$ or less.

6. The Group III nitride stack according to claim 1, wherein the carbon concentration in the upper layer is lower than the hydrogen concentration in the upper layer.

7. The Group III nitride stack according to claim 1, wherein the carbon concentration in the lower layer is lower than the hydrogen concentration in the lower layer.

8. The Group III nitride stack according to claim 1, wherein a silicon concentration in the upper layer is higher than a silicon concentration in the lower layer.

9. The Group III nitride stack according to claim 1, wherein a silicon concentration in the upper layer is $5\times10^{14}$ cm$^{-3}$ or more.

10. The Group III nitride stack according to claim 1, wherein a silicon concentration in the lower layer is less than $5\times10^{14}$ cm$^{-3}$.

* * * * *